US007009263B2

(12) United States Patent
Enders et al.

(10) Patent No.: US 7,009,263 B2
(45) Date of Patent: Mar. 7, 2006

(54) FIELD-EFFECT TRANSISTOR

(75) Inventors: Gerhard Enders, Olching (DE); Bjoern Fischer, Munich (DE); Helmut Schneider, Munich (DE); Peter Voigt, Hallbergmoos (DE)

(73) Assignee: Infineon Technologies AG, Munich (DE)

( * ) Notice: Subject to any disclaimer, the term of this patent is extended or adjusted under 35 U.S.C. 154(b) by 105 days.

(21) Appl. No.: 10/830,675

(22) Filed: Apr. 23, 2004

(65) Prior Publication Data

US 2004/0245576 A1 Dec. 9, 2004

(30) Foreign Application Priority Data

Apr. 24, 2003 (DE) ................................ 103 18 604

(51) Int. Cl.
*H01L 29/76* (2006.01)

(52) U.S. Cl. ...................... 257/401; 257/337; 257/327; 257/347

(58) Field of Classification Search ................ 257/401, 257/337, 327, 347
See application file for complete search history.

(56) References Cited

U.S. PATENT DOCUMENTS

| | | | | |
|---|---|---|---|---|
| 4,996,574 | A | 2/1991 | Shirasaki | |
| 6,111,296 | A * | 8/2000 | Yamazaki et al. | 257/401 |
| 2002/0011644 | A1 | 1/2002 | Lee | |

* cited by examiner

*Primary Examiner*—Sara Crane
(74) *Attorney, Agent, or Firm*—Slater & Matsil, L.L.P.

(57) ABSTRACT

A field-effect transistor includes a semiconductor substrate, a source region formed in the semiconductor substrate, a drain region formed in the semiconductor substrate, a channel region formed in the semiconductor substrate, wherein the source region is connected to a source terminal electrode and the drain region is connected to a drain terminal electrode, wherein the channel region comprises a first narrow width channel region and a second narrow width channel region connected in parallel regarding the source terminal electrode and the drain terminal electrode, and wherein the first narrow width channel region and/or the second narrow width channel region comprise lateral edges narrowing the width of the narrow width channel region is such a way that a channel formation in the narrow width channel region is influenced by a mutually influencing effect of the lateral edges, and a gate electrode arranged above the first and second narrow width channel regions.

17 Claims, 7 Drawing Sheets

FIELD-EFFECT TRANSISTOR

BACKGROUND OF THE INVENTION

1. Field of the Invention

The present invention relates to field-effect transistors.

2. Description of the Related Art

Field-effect transistors are employed in many of today's circuits. Field-effect transistors are, for example, used as driver transistors for circuits or as bit line isolating transistors for isolating bit lines, etc. With ever increasing requirements to circuits in which field-effect transistors are used, high switching speeds on the one hand and a small area consumption on a chip or wafer on the other hand are required for field-effect transistors. At the same time, the field-effect transistor should have the largest possible current efficiency, i.e. the largest possible source-drain current per layout area with a predetermined gate voltage.

A transistor which is as wide as possible, the current efficiency of which determines the switching speed obtainable, has been used for this in the prior art. Put differently, a well-known transistor has a width of the channel region defined by the circuit layout for obtaining a current efficiency. According to the well-known formula $R=\rho 1/A$, a low resistance and thus a high current efficiency are obtained by selecting a large width entering in the area A of the above formula. The width of a channel region can be thought of as a dimension formed in parallel to the substrate and perpendicular to a connection line between the source region and the drain region between edges or limits of the channel region. In general, the width of the channel region is thus perpendicular to the source-drain current direction.

FIG. 1 shows a well-known driver transistor in which a semiconductor substrate region 100 is formed over a large area in the form of a rectangle. A source terminal electrode 102, a drain terminal electrode 104 and a gate terminal electrode 106 are arranged on the semiconductor substrate region 100, wherein the gate terminal electrode 106 is generally separated from the semiconductor substrate region 100 by a gate oxide layer (not shown in FIG. 1). As is illustrated in FIG. 1, the source terminal electrode 102, the drain terminal electrode 104 and the gate terminal electrode 106 are formed in an elongate shape and arranged to one another in parallel. The gate terminal electrode 106 comprises a gate-contacting region 108 outside the semiconductor substrate region 100. The channel region of the driver transistor is formed in the semiconductor region 100 below the gate terminal electrode 106, wherein in the semiconductor substrate region 100 below the gate terminal electrode 106, the channel region is connected to a source region in the semiconductor substrate region 100 which is associated to the source terminal electrode 102 on one side and is connected to a drain region in the semiconductor substrate region 100 which is associated to the drain terminal electrode 104 on the other side. A field of application of field-effect transistors includes isolating bit lines. Thus, in the prior art a plurality of bit line isolating transistors are summarized to a bit line isolating assembly.

Referring to FIG. 2, an assembly of well-known bit line isolating transistors will be explained subsequently. The assembly includes three bit line isolating transistors 200*a*, 200*b* and 200*c*, each of which is arranged in a semiconductor substrate region 202*a*, 202*b*, 202*c*. Each bit line isolating transistor 200*a*, 200*b*, 200*c* comprises a source terminal electrode 204*a*, 204*b*, 204*c* and a drain terminal electrode 206*a*, 206*b*, 206*c*. A common gate terminal electrode 208 extends over all three bit line isolating transistors 200*a*, 200*b*, 200*c* between the source terminal electrodes 204*a*, 204*b*, 204*c* and the drain terminal electrodes 206*a*, 206*b*, 206*c*. Below the common gate terminal electrode 208, a channel region is formed in each semiconductor substrate region 202*a*, 202*b*, 202*c* of the bit line isolating transistors 200*a*, 200*b*, 200*c*, i.e. one channel region below the common gate terminal electrode 208 per semiconductor substrate region 202*a*, 202*b*, 202*c*. Each bit line isolating transistor 200*a*, 200*b*, 200*c*, in the semiconductor substrate region 202*a*, 202*b*, 202*c*, comprises a source region associated to the respective source terminal electrode 204*a*, 204*b*, 204*c* and a drain region associated to the respective drain terminal electrode 206*a*, 206*b*, 206*c*, wherein the channel region of each bit line isolating transistor 200*a*, 200*b*, 200*c* is formed between the source and drain regions of each bit line isolating transistor 200*a*, 200*b*, 200*c* and, in the semiconductor substrate region of the respective transistor, is connected to the source region of one side and connected to the drain region on the opposite side.

The assembly illustrated above forms a bit line isolator enabling each bit line connected to the source and drain terminal electrodes 204*a*, 204*b*, 204*c* and 206*a*, 206*b* and 206*c* to be isolated electrically by means of applying a suitable potential to the gate terminal electrode 208, so that an electric connection on the bit line is interrupted due to the pinch-off of the conductive channel caused by the potential.

The usage of the transistors described above, however, limits the overall capacity of the line driven by it with predetermined speed requirements. This means that the channel resistance R is set by selecting the width of the channel region such that an RC time constant $\tau=1/RC$ influencing the switching speed obtainable is obtained. Consequently, there is a conflict between obtaining the highest possible switching speed, wherein the largest possible channel widths are required for this, and obtaining a high component density per chip area unit. Put differently, the point is to obtain a higher current efficiency at the same time with a smaller area consumption compared to the prior art. Consequently, it has to be determined for each special circuit whether a limit of the area consumption or a high switching speed is desired, whereupon a circuit layout of the transistor is selected correspondingly. Thus, it would be desirable to improve the current efficiency of a transistor with a limited channel width, in particular in dynamic semiconductor circuits, such as, for example, in a bit line isolator.

SUMMARY OF THE INVENTION

It is the object of the present invention to provide an improved field-effect transistor having a small area consumption and a high current efficiency.

In accordance with a first aspect, the present invention provides a field-effect transistor having: a semiconductor substrate; a source region formed in the semiconductor substrate; a drain region formed in the semiconductor substrate; a channel region formed in the semiconductor substrate, wherein the source region is connected to a source terminal electrode and the drain region is connected to a drain terminal electrode, wherein the channel region has a first narrow width channel region and a second narrow width channel region connected in parallel regarding the source terminal electrode and the drain terminal electrode, and wherein the first narrow width channel region and/or the second narrow width channel region have lateral edges narrowing the width of the narrow width channel region such that a channel formation in the narrow width channel region is influenced by a mutually influencing effect of the lateral edges; and a gate electrode arranged above the first and second narrow width channel regions.

In accordance with a second aspect, the present invention provides a field-effect transistor assembly having a first inventive field-effect transistor and a second inventive field-effect transistor, wherein the first field-effect transistor and the second field-effect transistor have a common gate electrode.

In accordance with a third aspect, the present invention provides a field-effect transistor having: a semiconductor substrate; a source region formed in the semiconductor substrate; a drain region formed in the semiconductor substrate; a channel region formed in the semiconductor substrate, wherein the source region is connected to a source terminal electrode and the drain region is connected to a drain terminal electrode, wherein the channel region has a first narrow width channel region and a second narrow width channel region connected in parallel regarding the source terminal electrode and the drain terminal electrode, and wherein the first and/or second narrow width channel regions have a width perpendicular to the current flow direction through it of less than 100 nm; and a gate electrode arranged above the first and second narrow width channel regions.

The invention is based on the finding that an improved field-effect transistor having a higher current efficiency and an increased steepness of the output characteristic curve can be obtained by using an overall channel region having a plurality of narrowed channel regions connected in parallel each having a very small channel width instead of enlarging the width of a channel region as is done in the prior art. The result of the very small channel width of the narrowed channel regions is a change in the channel formation resulting from the mutually influencing channel edges. This effect, which is also referred to as the narrow width effect, results in an increased current efficiency, a higher steepness of the transfer characteristic curve (output current characteristic curve) and a reduced substrate control effect in the inventive field-effect transistor. Thus, according to the invention, an increased current gain results for transistor widths, i.e. widths of the channel region, of, for example, less than 100 nm when using one or several narrow narrow width channel regions connected in parallel, compared to full-area transistors, wherein the area consumption remains the same. This current gain is of particular importance in raster circuits since they are always area-critical and at the same time highly regular.

In one embodiment, two or more narrow width channel regions are provided which are arranged to one another essentially in parallel. In one embodiment, the narrow width channel regions are connected to one another within the semiconductor substrate region at the source and drain regions. In another embodiment, two or more semiconductor substrate regions having a narrow width channel region are provided, wherein they are completely separated from one another. The semiconductor substrate regions can be separated from one another by isolating areas which can, for example, comprise an $SiO_2$ material or other isolating materials used in semiconductor technology. In this embodiment, the semiconductor substrate regions are consequently electrically connected to one another via the drain and source terminal electrodes and thus connected in parallel.

In addition, in one embodiment one or several field-effect transistors having the inventive narrow width channel regions are provided, wherein they comprise a common continuous gate electrode.

The current efficiency of the field-effect transistor can be improved by the field-effect transistors embodied according to the invention, as is desired in dynamic semiconductor circuits, such as, for example, in a bit line isolator. According to the inventive field-effect transistor comprising a plurality of narrowed channel regions connected in parallel, the current efficiency obtainable per layout area can be increased considerably compared to a full-area field-effect transistor according to the prior art, wherein the area consumption remains the same. Since the switching speed obtainable of a field- effect transistor depends on the current efficiency of it, even increased switching speeds can be obtained with the inventive field-effect transistors. In addition, the overall capacity of the line driven by the field-effect transistor can be increased with predetermined speed requirements by using the inventive field-effect transistor.

In principle, the usage of the inventive field-effect transistors is possible in every integrated circuit, the manufacturing process of which enables the required small widths of the narrowed channel regions. This is particularly the case in DRAM (dynamic random access memory) manufacturing processes, since the manufacturing of a DRAM cell field provides a process control suitable for realizing the inventive field-effect transistor.

BRIEF DESCRIPTION OF THE DRAWINGS

Preferred embodiments of the present invention will be detailed subsequently referring to the appendage drawings, in which.

DESCRIPTION OF THE PREFERRED EMBODIMENTS

Figure 4A:
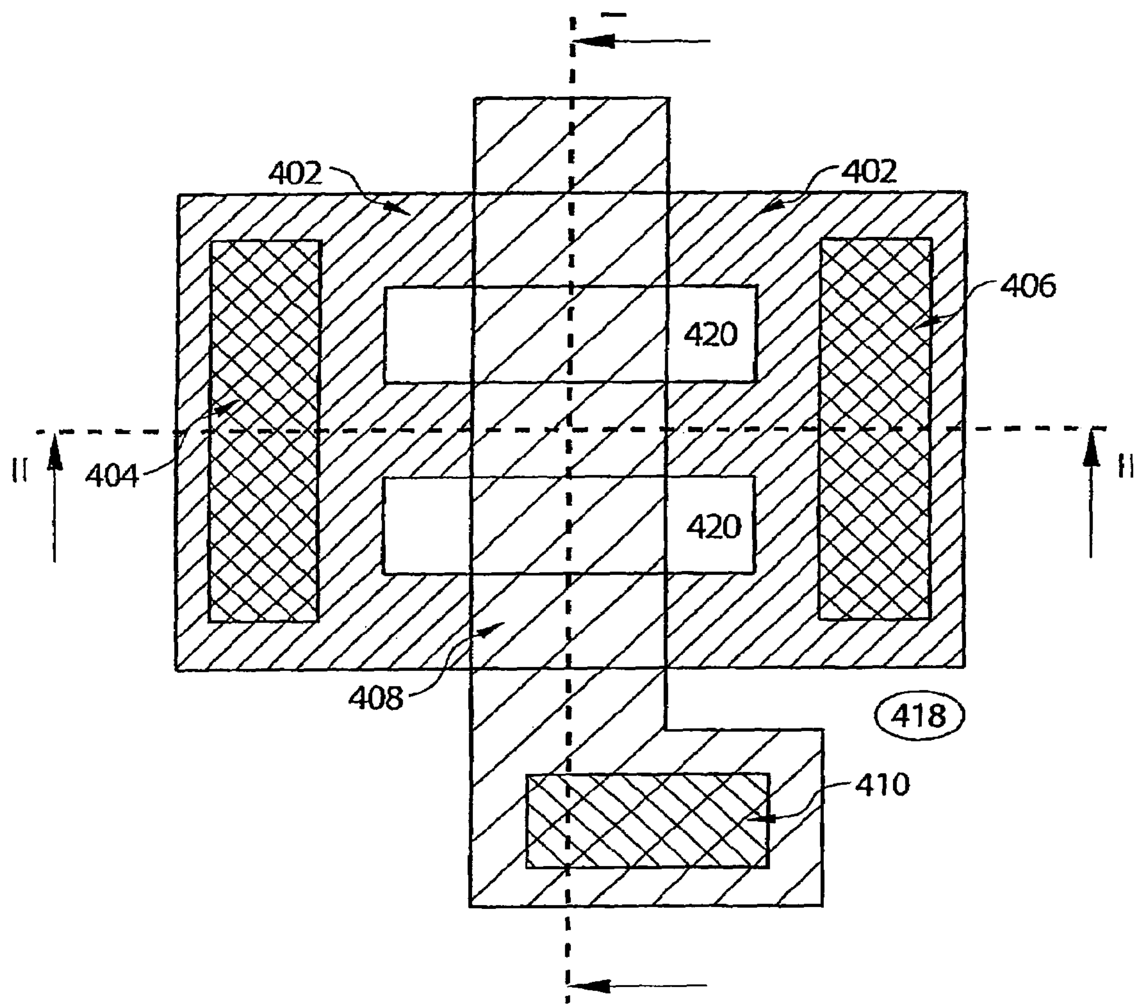
FIGS. 4*a–c* show schematic illustrations with a top view and with two sectional views of a field-effect transistor according to a first embodiment of the present invention.
Figure 4B:
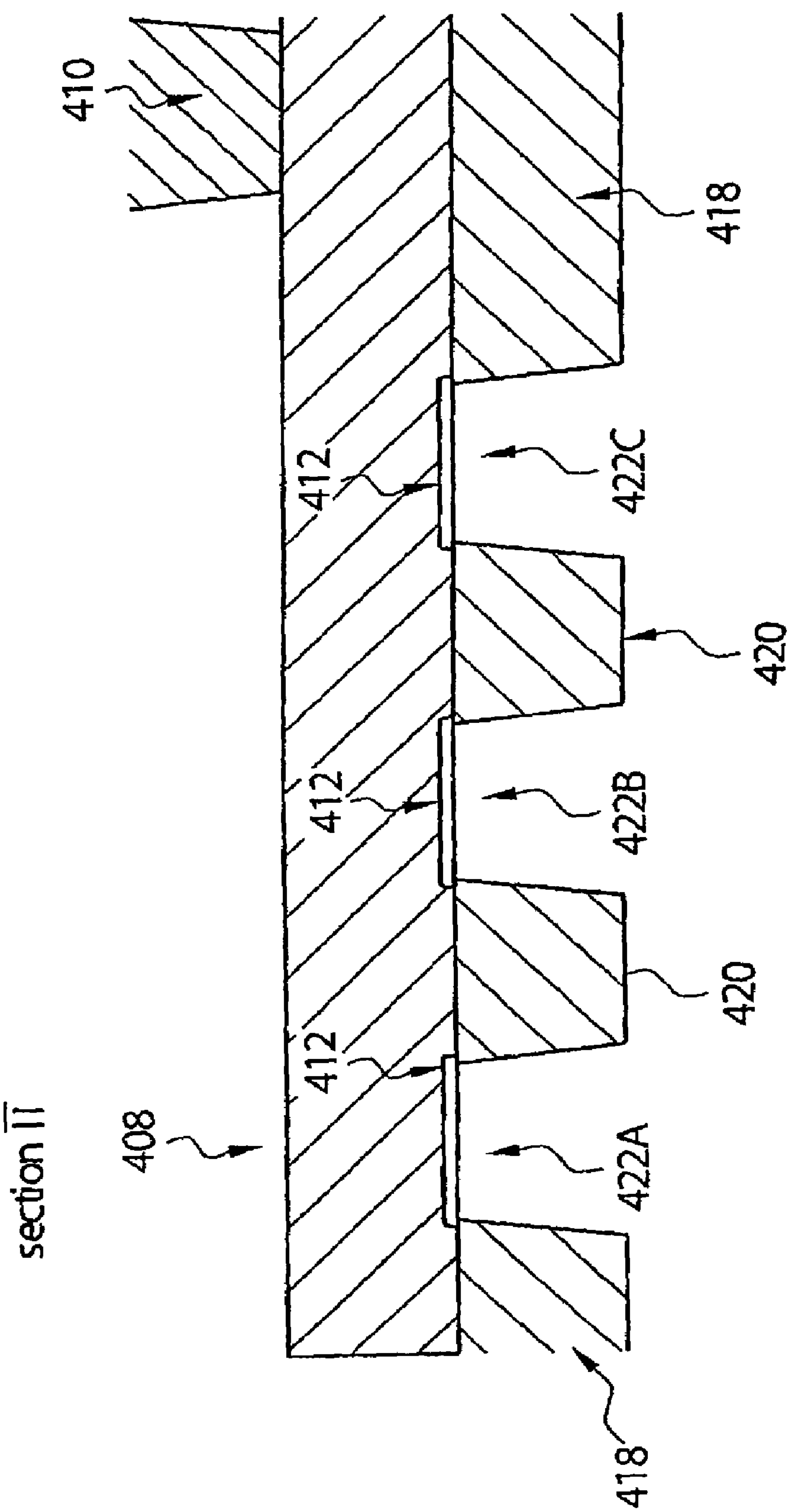
Figure 4C:
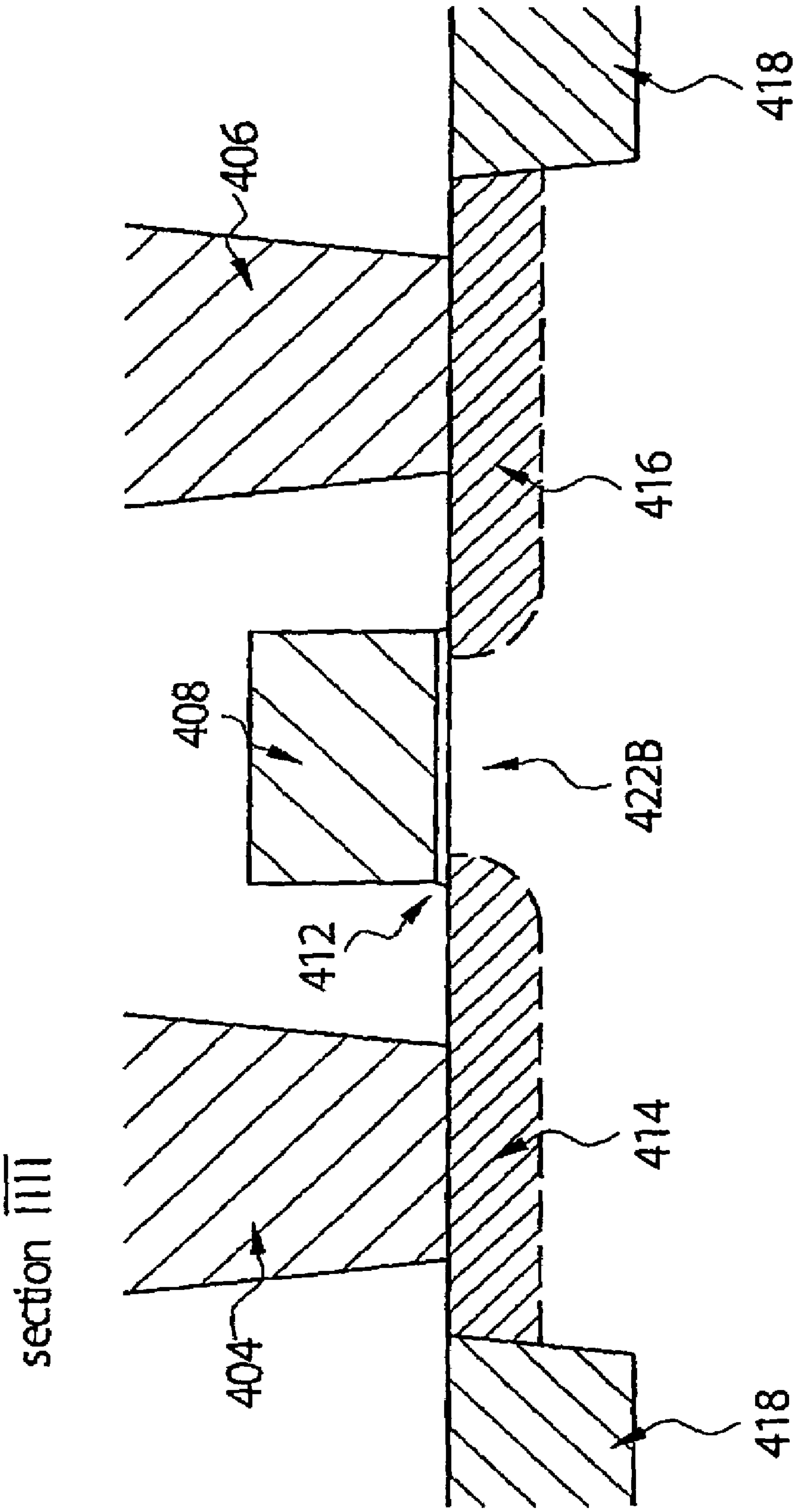

Referring to FIGS. 4*a–c*, a field-effect transistor according to a first preferred embodiment of the present invention will be explained subsequently. FIG. 4*a* shows a top view of the inventive field-effect transistor, wherein FIG. 4*b* illustrates a sectional view along the section A—A and FIG. 4*c* illustrates a sectional view along the section B—B.

The field-effect transistor 400 includes a substrate 402 which can include a homogenous substrate made of a single material or of several layers arranged one above the other. The substrate 402 includes semiconductor materials, such as, for example, silicon or GaAs (gallium arsenide).

As is illustrated in FIG. 4*a*, a source terminal electrode 404 and a drain terminal electrode 406 are formed on the semiconductor substrate 402 of the field-effect transistor 400. In the embodiment of the inventive field-effect transistor 400 illustrated in FIG. 4*a*, the source terminal electrode 404 and the drain terminal electrode 406 are arranged alongside and in parallel to each other on opposite portions of the semiconductor substrate 402. A gate terminal electrode 408 having a gate electrode contacting region 410 extends between the source terminal electrode 404 and the drain terminal electrode 406 above the semiconductor substrate 402.

A gate oxide layer 412 is arranged below the gate terminal electrode 408, as is illustrated in FIGS. 4*b* and 4*c*.

As is illustrated in FIG. 4*c*, a continuous source region 414 associated to the source terminal electrode 404 and a continuously formed drain region 416 associated to the drain terminal electrode 406 are arranged in the semiconductor substrate 402. As is also illustrated in FIGS. 4*b* and 4*c*, the field-effect transistor 400, outside the semiconductor substrate 402, comprises a field isolation area 418, which is also referred to as STI (shallow trench isolation) region. In the context of the present invention, the lateral isolation of neighboring field-effect transistors and the lateral isolation of neighboring regions of a field-effect transistor by trenches etched into the semiconductor substrate 402 and filled with an isolating material are meant by shallow trench isolation. As is also illustrated in FIGS. 4*a* and 4*b*, further isolation regions 420, which will subsequently be referred to as narrow width isolation regions 420, are formed in the semiconductor substrate 402 between the source region 414 and the drain region 416 in the semiconductor substrate below the gate terminal electrode 408.

As is illustrated in FIG. 4*a*, the narrow width isolation regions 420 between the source region 414 and the drain region 416 are elongate and arranged with a distance to one another and perpendicular in relation to the gate terminal electrode 408.

As is illustrated in FIGS. 4*b* and 4*c*, the channel region forms during the operation of the inventive field-effect transistor 400 between the source region 414 and the drain region 416 below the gate terminal electrode 408 (control electrode) of the field-effect transistor 400, wherein the channel region, in the embodiment illustrated in FIGS. 4*a*–4*c*, is divided into a first narrow width channel region 422*a*, a second narrow width channel region 422*b* and a third narrow width channel region 422*c* due to the narrow width isolation regions 420.

It is to be noted that, corresponding to the inventive concept, at least one narrow width isolation region 420 is arranged in the channel region of the field-effect transistor 400 to obtain a division into at least two channel regions of the field-effect transistor 400.

As becomes clear from FIGS. 4*a*–*c*, the different narrow width channel regions 422*a*–*c* of the field-effect transistor 400 below the gate terminal electrode 408 are "connected in parallel", i.e. the narrow width channel regions 422*a*–*c* are connected to the common source region 414 on the one side of the field-effect transistor 400 and connected to the common drain region 416 on the other side. For this reason, a current flows in parallel from the source region 414 via the narrow width channel regions 422*a*–*c* to the drain region 416 of the field-effect transistor 400 during the operation of the inventive field-effect transistor 400. Put differently, a part of the source-drain overall current flows in each of the parallel narrow width channel regions 422*a*–*c* with a suitable gate voltage (control voltage) at the gate terminal electrode 408, whereby the narrow width channel regions 422*a*–*c* are connected in parallel to one another.

The source, drain and gate terminal electrodes 404, 406, 408 of the inventive field-effect transistor 400 can comprise any material used in the prior art and can be formed by any known method. In addition, the active transistor regions in the semiconductor substrate 402 of the field-effect transistor 400, too, include the materials and doping relations known from the prior art and are preferably formed by the known manufacturing processes. The doping densities and doping types for the source region 414, the drain region 416 and the narrow width channel regions 422*a*–*c* can correspond to known relations for field-effect transistors corresponding to the prior art. The narrow width channel regions 422*a*–*c* preferably all include the same material and the same doping densities, wherein it is, however, also possible for the narrow width channel regions 422*a*–*c* to provide different materials and/or doping types and doping densities.

In operation, a first potential is applied to the source terminal electrode 404 and a second potential is applied to the drain terminal electrode 406 in the inventive field-effect transistor 400. Another potential applied to the gate terminal electrode 408 controls the transistor current flowing from the source region 414 associated to the source terminal electrode 404 to the drain region 416 associated to the drain terminal electrode 406 or vice versa. With suitable potential ratios (for the operation of a field-effect transistor), the conductive channel regions 422*a*–*c* thus form below the gate terminal electrode 408, wherein during the corresponding transistor operation the transistor current flow is made possible through the conductive narrow width channel regions 422*a*–*c* in parallel.

Figure 1:
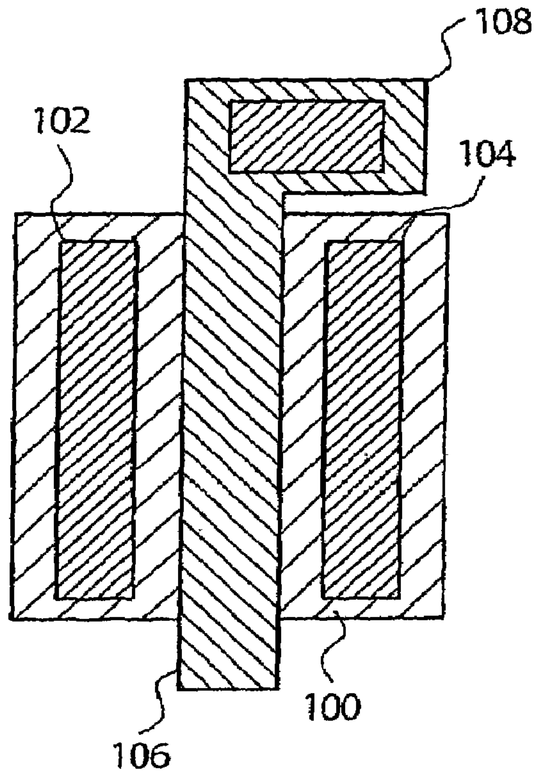
FIG. 1 is a schematic illustration of a top view of a well-known driver transistor.

Although, in the inventive field-effect transistor 400 according to FIGS. 4*a*–*c*, the cross-sectional area available for the current transport of the narrow width channel regions 422*a*–*c*, compared to the channel region of a well-known field-effect transistor shown in FIG. 1 is decreased, an increased current efficiency and a higher steepness of the transfer characteristic curve results favorably. The cross-sectional area available for the current transport of the narrow width channel regions 422*a*–*c* is decreased since in the inventive field-effect transistor the cross-sectional area consists of the sum of the cross-sectional area of the channel regions 422*a*–*c*, wherein the cross-sectional area of a channel region 422*a*– *c* consists of a width, that is parallel to the semiconductor substrate 402 and perpendicular to the current flow, and of a depth of the channel region into the semiconductor substrate, wherein, by forming the narrow width isolation regions 420 in the semiconductor substrate 402, the overall cross-sectional area available for the current transport in the inventive field-effect transistor 400 is obviously decreased compared to field-effect transistors known from the prior art, as is shown in FIG. 1.

By forming the narrow width channel regions 422*a*–*c*, an increased current efficiency and a higher steepness of the transfer characteristic curve most favorably result in the inventive field-effect transistor 400. This results from the fact that a plurality of narrow width channel regions 422*a*–*c* results by providing one or several narrow width isolation regions 420, wherein the width of a narrow width channel region, in the inventive field-effect transistor 400, favorably is in a range below 100 nm and preferably in a range of 20–90 nm. Thus, in the inventive field-effect transistor 400, the narrow width effect already mentioned results in the semiconductor material in the narrow width channel regions 422*a–c* by the small width of the individual narrow width channel regions 422*a–c* regarding the charge transport features so that an improved current characteristic of the inventive field-effect transistor 400 compared to conventional field-effect transistors can be achieved.

The narrow width effect results due to a change of the channel formation as a consequence of the mutually influencing channel edges of the respective restriction channel regions 422*a–c*, i.e. regarding the current flow direction through them, the narrow width channel regions 422*a–c* comprise lateral edges narrowing the width of the narrow width channel region in such a way that a channel formation in the narrow width channel region is influenced by a mutually influencing effect of the lateral edges. This effect is also referred to as corner effect.

Put differently, an improved current characteristic is obtained by (partially) narrowing the channel width by the narrow widths isolation regions 420 compared to the well-known transistor shown in FIG. 1 having a channel region with a width which is the same width as the entire inventive channel region, i.e. the sum of the widths of the isolation regions 420 and the narrow width channel regions 422*a–c*. This is to be made clear subsequently referring to a diagram illustrated in FIG. 3.

Figure 3:
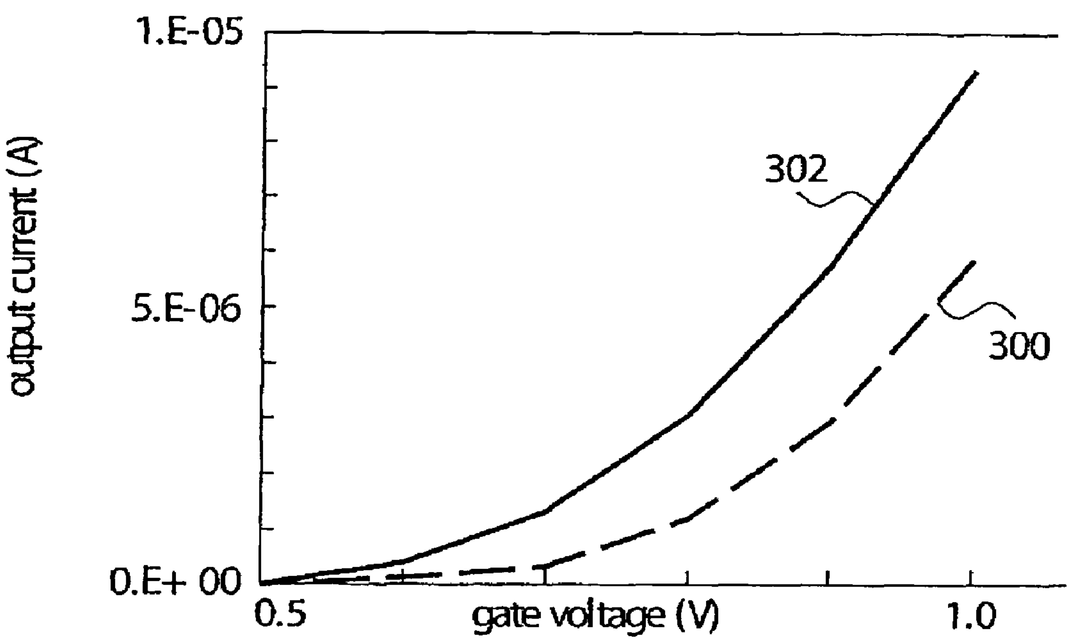
FIG. 3 is a graphic illustration of a characteristic curve of a well-known transistor and of a transistor according to an embodiment of the present invention, wherein a channel current is shown versus a gate voltage.

FIG. 3 shows a physical simulation performed by the inventors as to how the output currents behave regarding one another according to the standard approach and when making use of the present invention. The characteristic curve illustrated in FIG. 3 in a broken line having the reference numeral 300 shows the result of the calculations for a well-known standard transistor having a width of 190 nm. In addition, the diagram of FIG. 3 shows a characteristic curve 302 performed by a calculation for a field-effect transistor according to an embodiment of the present invention, in which two narrow width channel regions each having a width of 70 nm are present. In both cases, i.e. in the well-known field-effect transistor and the inventive field-effect transistor, the layout area is identical, wherein it can be derived from the diagram that the output current, with an equal gate voltage, can be increased considerably with the inventive concept. In the example shown in FIG. 3, the increase with the highest gate voltage of 1 V is about 50%. Consequently, a considerably improved characteristic curve characteristic results by the narrow width effect, i.e. compared to well-known transistors, narrowing the channel width for a respective narrow width channel region to a value below 100 nm. Thus, an improved current characteristic can be achieved with the inventive transistor, wherein the area consumption on the chip remains the same.

Figure 5:
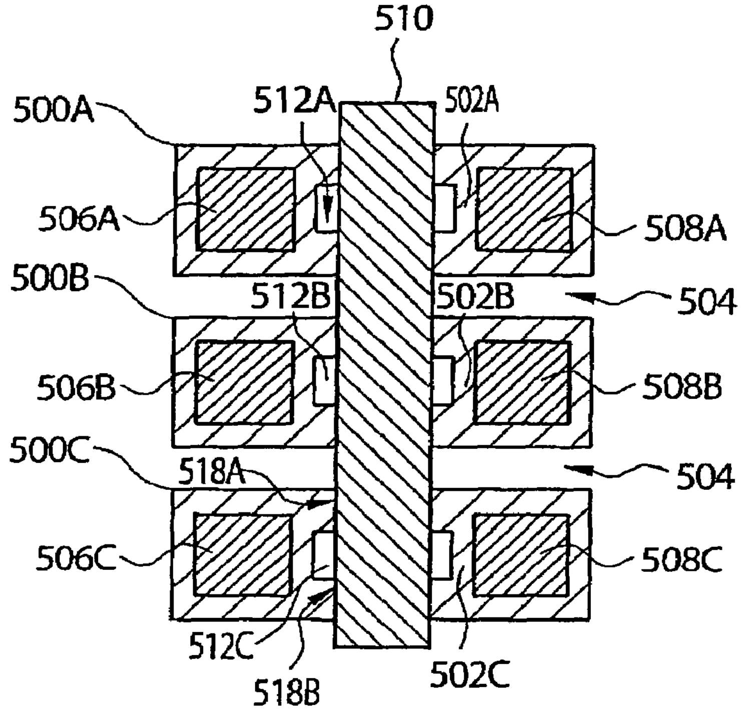
FIG. 5 is a schematic illustration of a top view of an assembly of several field-effect transistors according to another embodiment of the present invention, wherein the channel regions of the field-effect transistor are connected via a common continuous gate electrode.

Referring to FIG. 5, a bit isolator assembly will be explained subsequently as another embodiment of the present invention. FIG. 5 shows an assembly of three inventive field-effect transistors 500*a–c* which are each spaced apart from one another and arranged in parallel to one another. The three field-effect transistors 500*a–c* comprise an active semiconductor substrate region 502*a–c*, wherein the active semiconductor substrate regions 502*a–c* are separated from one another by a field isolation region 504 (STI isolation region). Each of the field-effect transistors 500*a–c* comprises a source terminal electrode 506*a–c* and, on the opposite side, a drain terminal electrode 508*a–c*. A common gate terminal electrode 510 is formed between the source terminal electrodes 506*a–c* and the drain terminal electrodes 508*a–c* of the field-effect transistors 500*a–c*, wherein a gate oxide layer (not shown in FIG. 5) is preferably arranged below the common gate terminal electrode 510. A narrow width isolation region 512*a–c* is in each active semiconductor substrate region 502*a–c*. To each source terminal electrode 506-*c*, a source region 514*a–c* in the active semiconductor substrate region 502*a–c* is associated, wherein to each drain terminal electrode 508*a–c* a drain region 516*a–c* in the active semiconductor region 502*a–c* is associated. Two narrow width channel regions 518*a, b* are formed below the common gate terminal electrode 510 between the source region 514*a–c* and the drain region 516*a–c* of each active semiconductor substrate region 502*a–c* of each field-effect transistor 500*a–c*. Each of the narrow width channel regions 518*a, b* of the field-effect transistors 500*a–c* inventively comprises a lateral width under 100 nm in order to achieve an improved current characteristic in the form of an increased channel current by the narrow width effect already explained referring to FIGS. 4*a–c*.

The narrow width channel regions 518*a, b* are also spaced apart from each other via the narrow width isolation regions 512*a–c*. In addition, it becomes clear from FIG. 5 that the elongate-formed gate terminal electrode 510 is arranged over the narrow width channel regions 518*a, b* of the three field-effect transistors 500*a–c* such that the field-effect transistors 500*a–c* each have a common gate terminal electrode.

Figure 2:
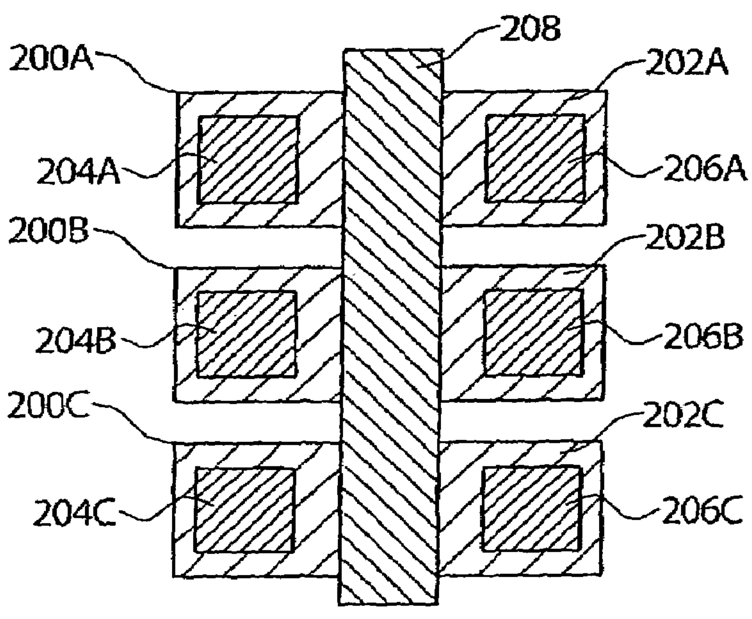
FIG. 2 is a schematic illustration of a top view of a well-known bit line isolator.

The arrangement shown in FIG. 5 illustrates a bit line isolator, wherein, compared to the well-know bite line isolator shown in FIG. 2, it has improved features, i.e. an increased current efficiency and a steeper transfer characteristic curve due to the inventive narrow width channel regions 518*a, b*, wherein this in turn is a result of the effects already explained in FIGS. 4*a–c*, i.e. the narrow width effect and the corner effect.

Figure 6:
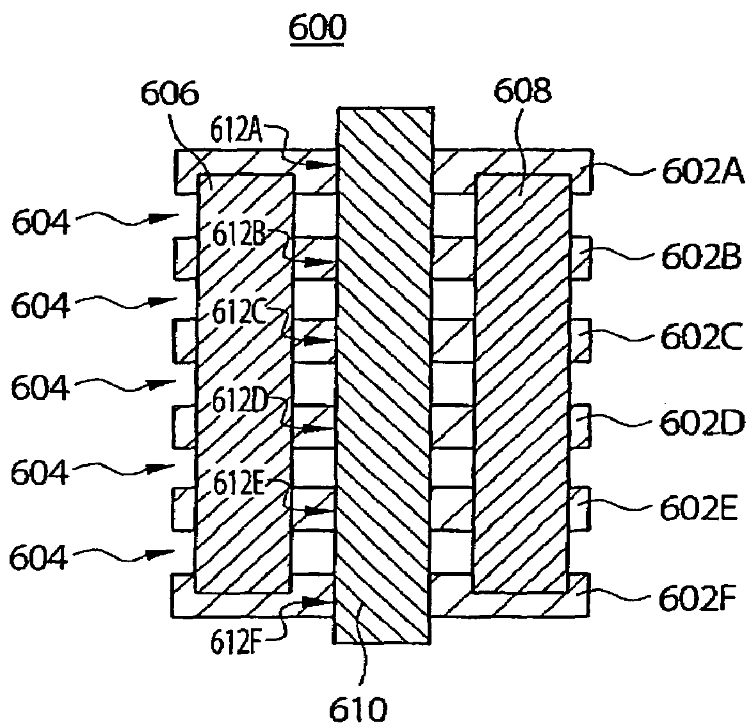
FIG. 6 is a schematic illustration of a top view of another field-effect transistor according to another embodiment of the present invention, wherein the semiconductor substrate regions are completely separated from one another.

Referring to FIG. 6, another embodiment of a driver transistor according to the present invention will be explained subsequently. The driver transistor 600 according to FIG. 6 comprises a plurality of active semiconductor substrate regions, i.e. in the present embodiment, for example, six active semiconductor substrate regions 602*a–f*, which are formed in an elongate shape and arranged to one another essentially in parallel. The respective active semiconductor substrate regions 602*a–f* of the driver transistor 600 are preferably spaced apart from one another by field isolation regions 604. As is also illustrated in FIG. 6, a common source terminal electrode 606 for all active semiconductor substrate regions 602*a–f* is arranged on one side of the active semiconductor substrate region 602*a–f* and a common drain terminal electrode 608 for all active semiconductor substrate regions 602*a–f* is arranged on the opposite side of the active semiconductor substrate regions 602*a–f*. Between the source and drain terminal electrodes 606, 608, a common gate terminal electrode 610 is arranged over all the active semiconductor substrate regions 602*a–f*, below which there is, for example, again a gate oxide layer (not shown in FIG. 6) for isolation purposes. The respective (narrowed) channel regions 612*a–f* corresponding to the width of the active semiconductor substrate regions 602*a–f* are formed below the gate terminal electrode 610, wherein in the semiconductor substrate region 602*a–f* the channel regions 612*a–f* of the driver transistor 600 are connected to source regions 614*a–f* associated to the source terminal electrode 606 on one side and connected to drain regions 616*a–f* associated to the drain terminal electrode 608 on the opposite side. The active semiconductor substrate regions 602*a–f*, in the region of the channel regions 612*a–f*, below the gate terminal electrode 610 preferably have a width under 100 nm. By means of the common gate terminal electrode 610 for all the active semiconductor substrate regions 602*a–f* of the driver transistor 600, a common control of the parallel assembly of narrow width channel regions 612*a–f* below the common gate terminal electrode 610 is made possible. According to the invention, the driver transistor assembly 600 illustrated in FIG. 6 again results in an improved current characteristic.

Figure 7:
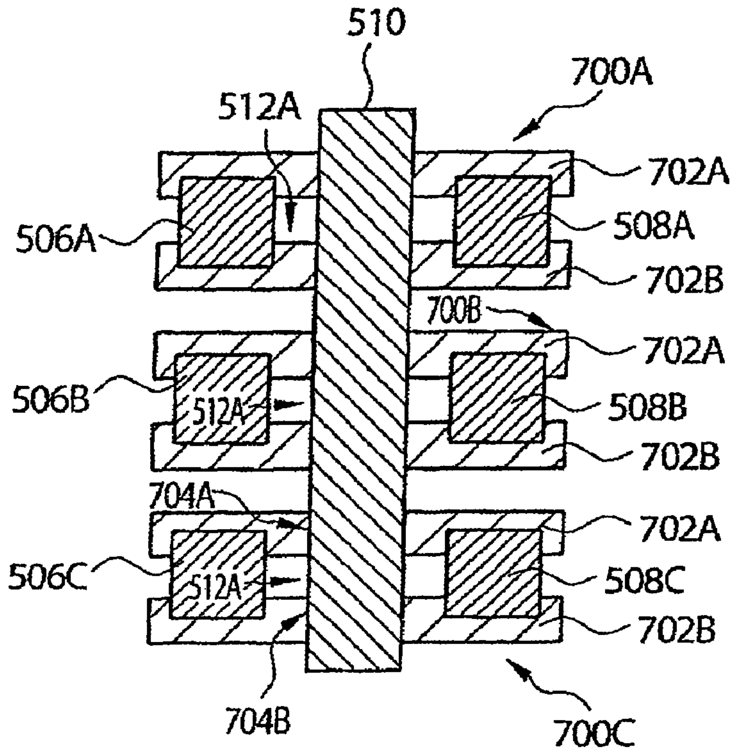
FIG. 7 is a schematic illustration of a top view of an assembly of field-effect transistors according to another embodiment of the present invention, wherein the semiconductor substrate regions are completely separated from one another.

As another embodiment of the present invention, FIG. 7 shows a development of the bit line isolator shown in FIG. 5, wherein identical elements are again designated with the same reference numerals, wherein another description of these elements is omitted. In contrast to the bit line isolator according to FIG. 5, the respective transistors 700*a–c* of the bit line isolator shown in FIG. 7 have two active semiconductor substrate regions 702*a, b* which are completely isolated from one another. It becomes evident that, below the common gate terminal electrode 510, a respective narrow width channel region 704*a* forms in the active semiconductor substrate regions 702*a* and a respective narrow width channel region 704*b* forms in the active semiconductor substrate regions 702*b*. The active semiconductor substrate region 702*a, b* of each transistor 700*a–c* are connected to mutually separated source terminal electrodes 506*a–c* and connected to mutually separated drain terminal electrodes 508*a–c*.

Figure 8:
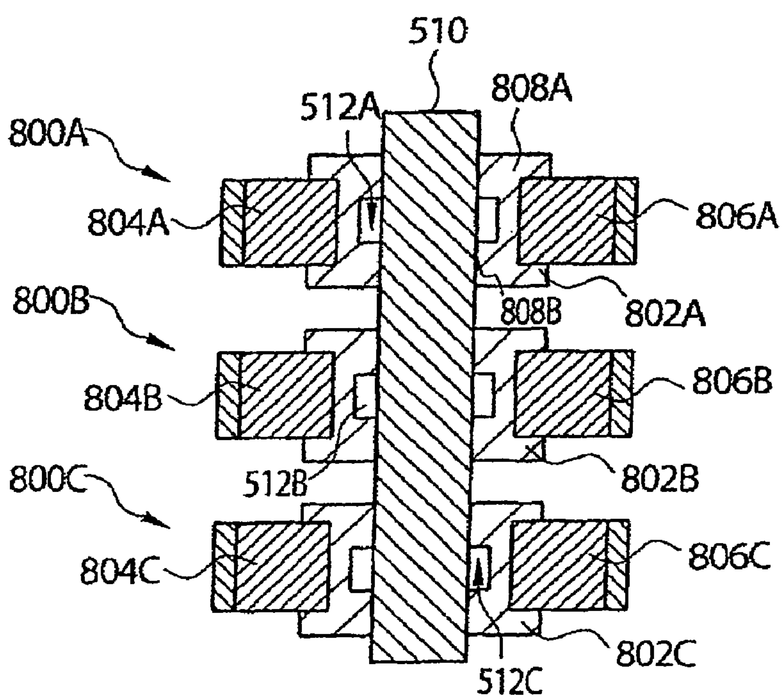
FIG. 8 is a schematic illustration of a top view of an assembly of field-effect transistors according to another embodiment of the present invention.

In addition, another development of the bit line isolator shown in FIG. 5 is illustrated in FIG. 8, wherein in the bit line isolator according to FIG. 8, the active semiconductor substrate region 802*a–c* of each transistor 800*a–c* comprises a reduced length so that the respective drain and source terminal electrodes 804*a–c*, 806*a–c* are not completely surrounded by the respective active semiconductor substrate regions 802*a–c*. Corresponding to the embodiment of FIG. 5, each of the semiconductor substrate regions 802*a–c* comprises a pair of narrow width channel regions 808*a, b*. The embodiment shown in FIG. 8 makes a further area reduction possible by the additional reduction of the active semiconductor substrate regions 802*a–c* so that an even denser assembly of components on a chip becomes possible.

Although the embodiments of the present invention are each described having a rectangular semiconductor substrate region and channel regions, different forms of semiconductor substrate regions and channel regions may be provided in other preferred embodiments. A semiconductor substrate region which, for example, in the middle below the gate terminal electrode has a minimum channel width under 100 nm and otherwise can also comprise semiconductor substrate regions having a width of over 100 nm can also be provided. According to the present invention, an advantageous channel region will already be obtained if only one portion of the channel region between the source and drain regions in the semiconductor substrate is below the width of 100 nm required for the effect of an improved current characteristic.

It is to be mentioned that corresponding to the inventive concept, a division of the channel region of the field-effect transistor into at least two narrow width channel regions takes place. For this, it is possible according to the invention to arrange a narrow width isolation region in the channel region of the field-effect transistor to obtain a division into at least two channel regions of the field-effect transistor. According to the invention, it is, however, also possible to provide at least two semiconductor substrate regions separated by an isolation region for the inventive field-effect transistor, which are, for example, connected in parallel by the common source terminal electrode and the common drain terminal electrode, wherein in this case each semiconductor substrate region comprises a narrow width channel region.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A field-effect transistor comprising:

a semiconductor substrate;

a source region formed in the semiconductor substrate;

a drain region formed in the semiconductor substrate;

a channel region formed in the semiconductor substrate, wherein the source region is connected to a source terminal electrode and the drain region is connected to a drain terminal electrode, wherein the channel region comprises a first narrow width channel region and a second narrow width channel region connected in parallel regarding the source terminal electrode and the drain terminal electrode, and wherein the first narrow width channel region and/or the second narrow width channel region have lateral edges narrowing the width of the narrow width channel region in such a way that a channel formation in the narrow width channel region is influenced by a mutually influencing effect of the lateral edges; and a gate electrode arranged above the first and second narrow width channel regions.

2. The field-effect transistor according to claim 1, wherein the first narrow width channel region and the second narrow width channel region are separated by an isolation region.

3. The field-effect transistor according to claim 1, wherein the first narrow width channel region and the second narrow width channel region are arranged in parallel to each other.

4. The field-effect transistor according to claim 1, wherein the narrow width channel regions are connected to one another in the region between the source region and the drain region.

5. The field-effect transistor according to claim 1, wherein the semiconductor substrate comprises a first and a second semiconductor substrate region which are separated from each other by an isolation region, wherein the first semiconductor substrate region comprises the first narrow width channel region and the second semiconductor substrate region comprises the second narrow width channel region.

6. The field-effect transistor according to claim 1, wherein a plurality of semiconductor substrate regions are provided.

7. The field-effect transistor according to claim 1, wherein the field-effect transistor is a driver transistor or a bit line isolator transistor.

8. The field-effect transistor according to claim 1, wherein the narrow width channel region comprises a width perpendicular to the current flow direction through it of less than 100 nm.

9. The field-effect transistor according to claim 8, wherein the narrow width channel region comprises a width perpendicular to the current flow direction through it of between 30 and 90 nm.

10. A field-effect transistor assembly comprising:

a first field-effect transistor according to claim 1; and a second field-effect transistor according to claim 1, wherein the first field-effect transistor and the second field-effect transistor comprise a common gate electrode.

11. A field-effect transistor comprising:

a semiconductor substrate;

a source region formed in the semiconductor substrate;

a drain region formed in the semiconductor substrate;

a channel region formed in the semiconductor substrate, wherein the source region is connected to a source terminal electrode and the drain region is connected to a drain terminal electrode, wherein the channel region comprises a first narrow width channel region and a second narrow width channel region connected in parallel regarding the source terminal electrode and the drain terminal electrode, and wherein the first and/or second narrow width channel regions have a width perpendicular to the current flow direction through it of less than 100 nm; and a gate electrode arranged above the first and second narrow width channel regions.

12. The field-effect transistor according to claim 11, wherein the first narrow width channel region and the second narrow width channel region are separated by an isolation region.

13. The field-effect transistor according to claim 11, wherein the first narrow width channel region and the second narrow width channel region are arranged in parallel to each other.

14. The field-effect transistor according to claim 11, wherein the narrow width channel regions are connected to one another in the region between the source region and the drain region.

15. The field-effect transistor according to claim 11, wherein the semiconductor substrate comprises a first and a second semiconductor substrate region separated from each other by an isolation region, wherein the first semiconductor substrate region comprises the first narrow width channel region and the second semiconductor substrate region comprises the second narrow width channel region.

16. The field-effect transistor according to claim 11, wherein a plurality of semiconductor substrate regions are provided.

17. The field-effect transistor according to claim 11, wherein the field-effect transistor is a driver transistor or a bit line isolator transistor.

* * * * *